(12) United States Patent
Suzuki et al.

(10) Patent No.: US 6,727,871 B1
(45) Date of Patent: Apr. 27, 2004

(54) ELECTROLUMINESCENCE DISPLAY APPARATUS

(75) Inventors: Koji Suzuki, Aichi (JP); Tsutomu Yamada, Gifu (JP)

(73) Assignee: Sanyo Electric Co., Ltd. (JP)

( * ) Notice: Subject to any disclaimer, the term of this patent is extended or adjusted under 35 U.S.C. 154(b) by 150 days.

(21) Appl. No.: 09/679,102

(22) Filed: Oct. 4, 2000

(30) Foreign Application Priority Data

Oct. 4, 1999 (JP) .......................................... 11-283174

(51) Int. Cl.⁷ ................................................ G09G 3/30
(52) U.S. Cl. ........................ 345/76; 345/45; 313/498; 313/500; 313/503; 313/505; 313/512
(58) Field of Search ................ 345/76, 45; 313/498, 313/500, 503, 505, 512

(56) References Cited

U.S. PATENT DOCUMENTS

| | | | |
|---|---|---|---|
| 5,691,738 A | * 11/1997 | Arai et al. | 345/76 |
| 5,721,562 A | * 2/1998 | Kawashima et al. | 345/76 |
| 6,023,073 A | 2/2000 | Strite | |
| 6,114,715 A | 9/2000 | Hamada | |
| 6,280,861 B1 | 8/2001 | Hosokawa et al. | |
| 6,307,528 B1 | * 10/2001 | Yap | 345/45 |

| | | |
|---|---|---|
| 2002/0075422 A1 | 6/2002 | Kimura et al. |

FOREIGN PATENT DOCUMENTS

| | | |
|---|---|---|
| JP | 4-254887 | 10/1992 |
| JP | 10214043 | 11/1998 |
| WO | 97/46054 | 4/1997 |
| WO | 98/12689 | 3/1998 |

OTHER PUBLICATIONS

Notice of Grounds for Rejection, Japanese Patent Application Serial No. HEI 11-283174, Dated Aug. 27, 2002.
Office Action for Korean Patent Application Serial No. 10-2000-0058064, Dated Aug. 30, 2002.

* cited by examiner

Primary Examiner—Matthew C. Bella
Assistant Examiner—Tam Tran
(74) Attorney, Agent, or Firm—Cantor Colburn LLP

(57) ABSTRACT

Side faces of anodes have a tapered incline that becomes broader toward a lower layer. Thus, an emissive element layer is smoothly formed on the anodes making it possible to prevent field contraction of the electric field. An EL display apparatus having long life and high yield is provided by preventing the emissive element layer from rupturing between an anode and a cathode and by preventing concentration of the electric field at an upper edge of the anode facing the cathode and localized deterioration in the emissive element layer.

17 Claims, 7 Drawing Sheets

ELECTROLUMINESCENCE DISPLAY APPARATUS

BACKGROUND OF THE INVENTION

1. Field of the Invention

The present invention relates to a luminescence display apparatus comprising electroluminescence elements and thin-film transistors.

2. Description of the Related Art

In recent years, electroluminescence (referred to hereinafter as EL) display apparatuses employing EL elements as emissive elements have attracted attention as being the display apparatuses to replace CRTs and LCDs, and the research and development also have advanced on EL display apparatuses comprising thin-film transistors (referred to hereinafter as TFT) as switching elements to drive the EL elements.

FIG. 1 shows an equivalent circuit of an EL display apparatus comprising a conventional EL element and TFT.

FIG. 1 is an equivalent circuit of an EL display apparatus comprising a first TFT 130, a second TFT 140, and an organic EL element 160, and shows the circuitry near a gate signal line Gn of row n and a drain signal line Dm of column m.

The gate signal line Gn supplying a gate signal and the drain signal line Dm supplying a drain signal are perpendicular to each other, and near the intersection of both signal lines are provided the organic EL element 160 and the TFTs 130, 140 driving the organic EL element 160.

The first TFT 130, which is a switching TFT, comprises gate electrodes 131 connected to the gate signal line Gn and supplied with gate signals, a drain electrode 132 connected to a data signal line (drain signal line) Dm and supplied with data signals, and a source electrode 133 connected to a gate electrode 141 of the second TFT 140.

The second TFT 140, which is an organic EL element driver TFT, comprises the gate electrode 141 connected to the source electrode 133 of the first TFT 130, a source electrode 142 connected to an anode 161 of the organic EL element 160, and a drain electrode 143 connected to a driving power supply 150 that is supplied to the organic EL element 160.

Furthermore, the organic EL element 160 comprises the anode 161 connected to the source electrode 142, a cathode 162 connected to a common electrode 164, and an emissive element layer 163 sandwiched between the anode 161 and the cathode 162.

Furthermore, a storage capacitor 170 is provided with one electrode 171 connected between the source electrode 133 of the first TFT 130 and the gate electrode 141 of the second TFT 140 and another electrode 172 connected to a common electrode 173.

The driving method of the circuit shown in the equivalent circuit of FIG. 1 will now be described. When the gate signal from the gate signal line Gn is applied to the gate electrode 131, the first TFT 130 turns on. As a result, the data signal from the data signal line Dm is supplied to the gate electrode 141 and the voltage of the gate electrode 141 becomes identical to the voltage of the data signal line Dm. A current proportional to the voltage value supplied to the gate electrode 141 is then supplied from the driving power supply 150 to the organic EL element 160. As a result, the organic EL element 160 emits light at an intensity in accordance to the magnitude of the data signal.

A conventional EL display apparatus will be described next with reference to FIGS. 2, 3A, and 3B. FIG. 2 is a top view showing one pixel of the conventional EL display apparatus. In FIG. 2, a gate signal line 51 corresponds to the gate signal line Gn, a data signal line 52 corresponds to the data signal line Dm, a driving power supply 53 corresponds to the driving power supply 150, an electrode 54 corresponds to the electrode 172 of the storage capacitor 170, and an anode 61 corresponds to the anode 161 of the organic EL element 160. The gate signal lines 51 are arranged in rows and the data signal lines 52 and the driving supplies 53 are arranged in columns. The storage capacitor and the emissive element layer are arranged within the area thus partitioned. The storage capacitor is formed from a semiconductor film 13 and the electrode 54. The semiconductor film 13 is connected to the data signal line 52 via a contact C1, and a gate electrode 11 is arranged between a drain 13d and a source 13s.

A semiconductor film 43 is connected to the driving power supply 53 via a contact C2, and a gate electrode 41, which is connected to the semiconductor film 13, is arranged between a dragin 43d and a source 43s. The semiconductor film 43 is connected to the anode 61 of the organic EL element via a contact C3.

FIG. 3A is a cross-sectional view along line A—A of FIG. 2. On a transparent substrate 10 is formed the semiconductor film 13, on which is covered with and formed a gate insulating film 12. On the gate insulating film 12 are formed gate electrodes 11, which branch from the gate signal line 51, and the storage capacitor electrode 54, on which is covered with and formed an interlayer insulating film 15. On the interlayer insulating film 15 is arranged the data signal line 52, which connects to the semiconductor film 13 via the is contact C1. On these is covered with and formed a pilanarization insulating film 17.

FIG. 3B is a cross-sectional view along line B—B of FIG. 1. On the substrate 10 are laminated in sequence the semiconductor film 43, the gate insulating film 12, the gate electrode 41, and the interlayer insulating film 15, and on the interlayer insulating film 15 are formed the data signal line 52 and the driving power supply 53, on which is covered with and formed the planarization insulating film 17. On the planarization insulating film 17 is arranged an anode 61, which is connected to the semiconductor film 43 via the contact C3. On the anode 61 is arranged an emissive element layer 66, which has a laminated structure of a first hole transport layer 62, a second hole transport layer 63, an emissive layer 64, and an electron transport layer 65. A cathode 67 is arranged so as to cover them.

The anode 61 of the pattern shown in FIG. 2 is generally formed using a method in which an ITO film is first formed on the entire surface, and after forming a positive photoresist in predetermined shape, wet etching is performed using chemicals.

However, when forming the organic EL element in this manner, the emissive element layer 66 that is formed on the anode 61 is extremely thin at approximately 200 nm so that coverage at the step portion with the planarization insulating film 17 at the edge of the anode 61 deteriorates. Thus, at the points indicated by the arrows in FIG. 4, since the vertex of the anode 61 and the vertex of the cathode 67 face each other in closer proximity than at any other location, field concentration occurs here causing a problem where the emissive layer 64 positioned between layers deteriorates rapidly. As the coverage deteriorates further, the emissive element layer 66 ruptures as shown in the figure, and the cathode 67 provided on the upper layer shorts with the anode 61 to possibly cause this pixel to be defective and not display.

SUMMARY OF THE INVENTION

It is therefore an object of the present invention to provide an EL display apparatus having long life and high yield by preventing shorts or localized deterioration of the emissive layer 64 due to the thickness of the anode.

The present invention solves the aforementioned problem and is an electroluminescence display apparatus comprising an emissive element (an electroluminescence element) laminated in sequence on the substrate with the first electrode, the emissive element layer (such as hole transport layer, emissive layer, and electron transport layer), and the second electrode, with the side faces of the first electrode inclined and becoming broader toward the substrate side.

The angle formed by the incline of the first electrode and the plane of the lower layer (and/or the substrate) is 10° to 45°, or further an angle of 25° to 35°. Furthermore, the side of the first electrode has a tapered shape becoming broader from the emissive element layer toward the substrate.

Furthermore, the thickness of the first electrode is less than ½, or further less than ⅓ the total film thickness of the hole transport layer, the emissive layer, and the electron transport layer.

As described above, the edge of the first electrode in the present invention is inclined so that the electroluminescence element that is formed thereon is formed smoothly, shorting of the first electrode and the second electrode is prevented, and an electroluminescence display apparatus having a high yield is obtained.

Furthermore, since concentration of the electric field at the edge of the first electrode is prevented, the electroluminescence element is prevented from locally deteriorating, and a luminescence display apparatus having a long life is obtained.

Since the angle formed by the incline of the first electrode with the plane of the lower layer (and/or the substrate) is 10° to 45°, or further an angle of 25° to 35°, this ensures the emissive element layer can be formed without loss of reproducibility of the shape of the first electrode.

Furthermore, since the thickness of the first electrode is less than ½, or further less than ⅓, the film thickness of the emissive element layer, this ensures the emissive element layer can be formed.

DESCRIPTION OF THE PREFERRED EMBODIMENTS

Figure 5:
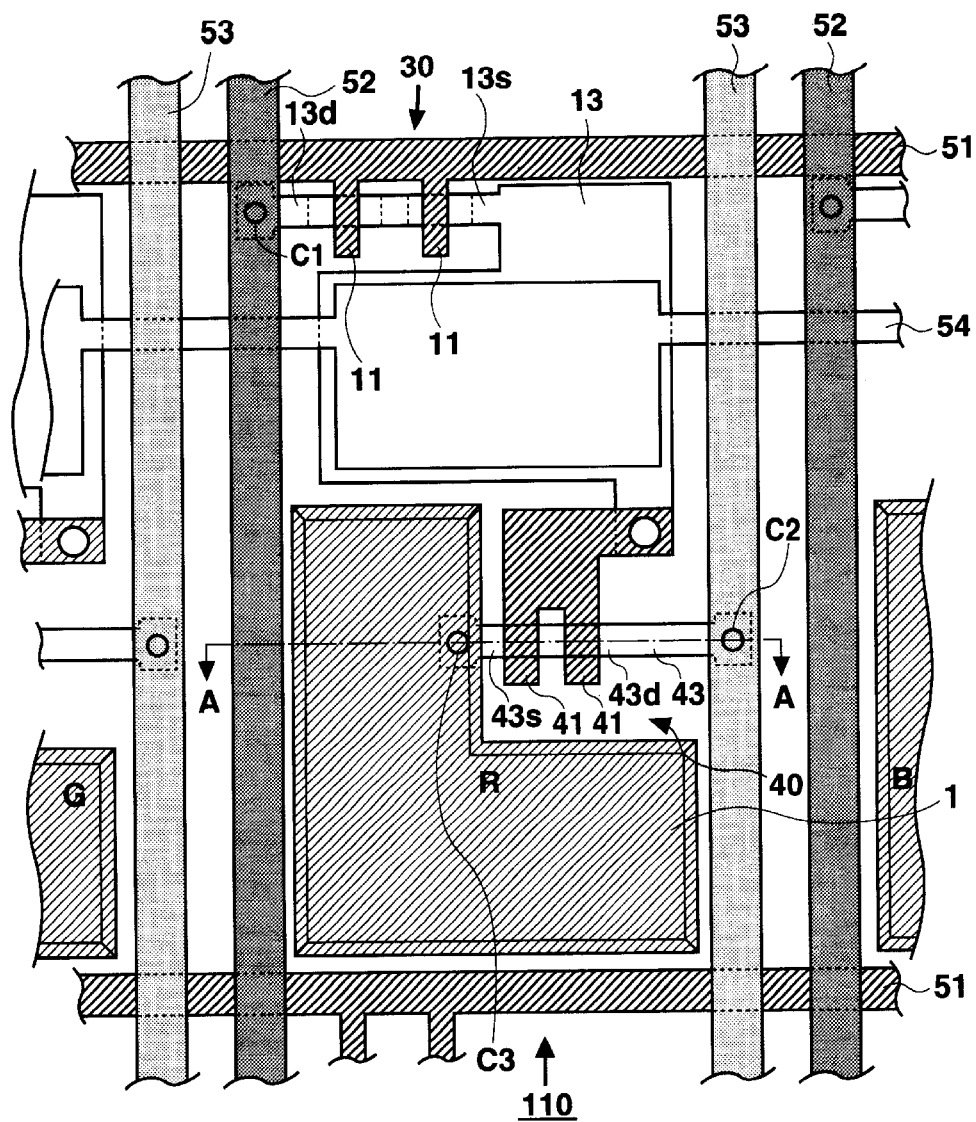
FIG. 5 is a top view of an active-matrix EL display apparatus of the present invention.
Figure 6:
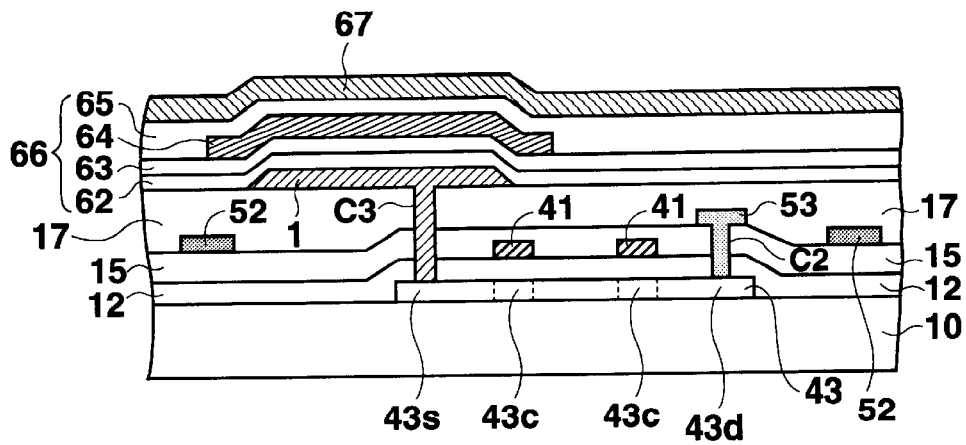
FIG. 6 is a cross-sectional view of the active-matrix EL display apparatus of the present invention.

A first embodiment of the present invention will be described hereinafter. The first embodiment is an example applying the present invention to an active-matrix organic EL display apparatus. One display pixel of the EL display apparatus of the first embodiment is shown in FIG. 5 and a cross-sectional view along line A—A in FIG. 5 is shown in FIG. 6.

Figure 1:
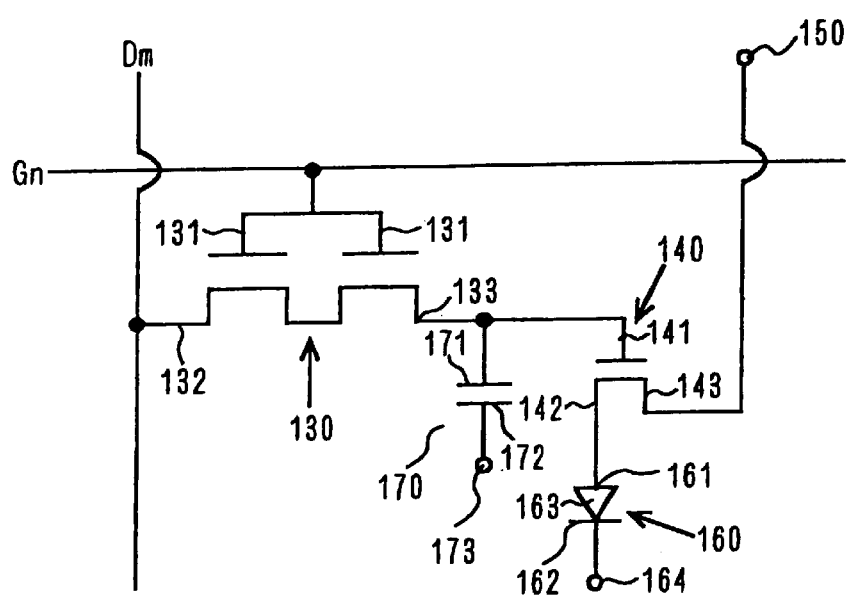
FIG. 1 is an equivalent circuit diagram of an EL display apparatus.
Figure 2:
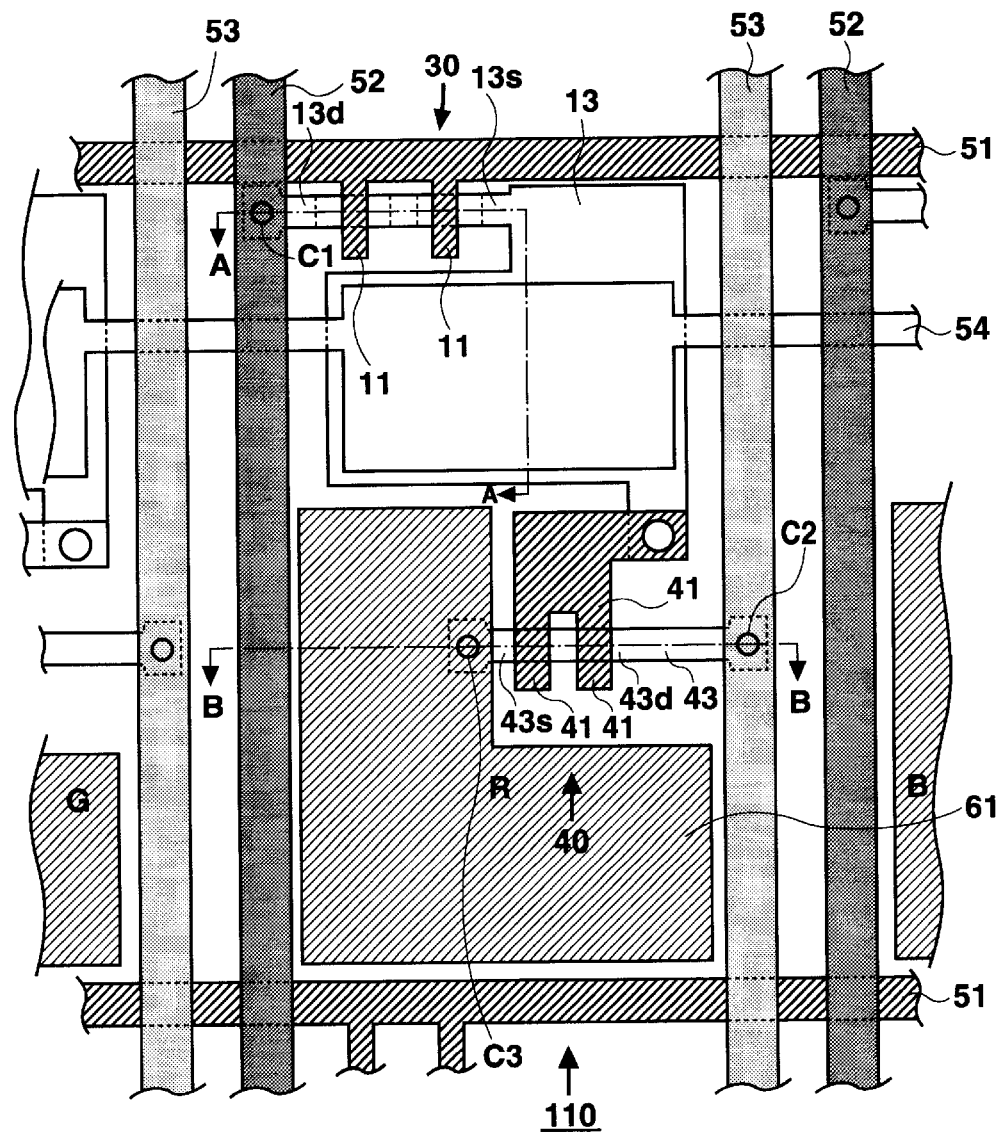
FIG. 2 is a cross-sectional view of the EL display apparatus of the present invention.
Figure 3A:
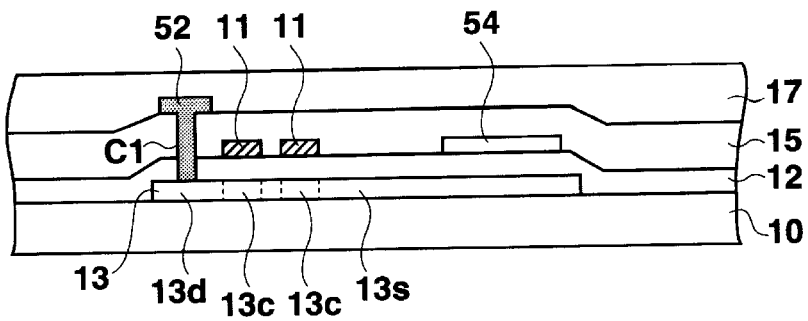
FIGS. 3A and 3B are cross-sectional views of the EL display apparatus of the present invention.
Figure 3B:
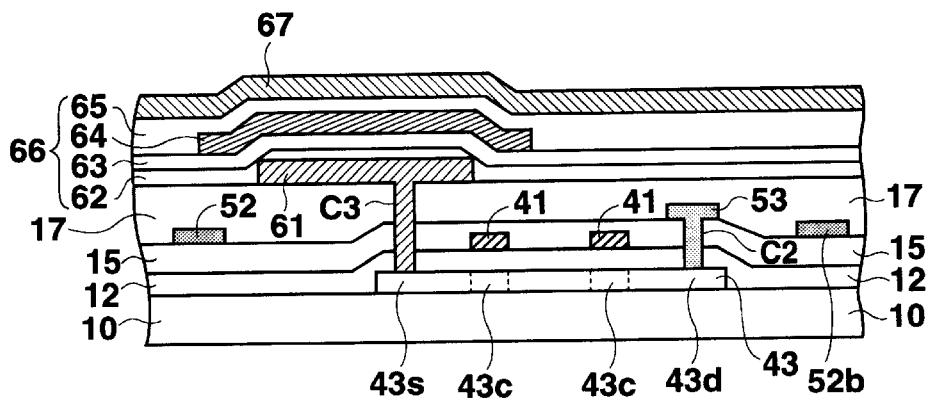
Figure 4:
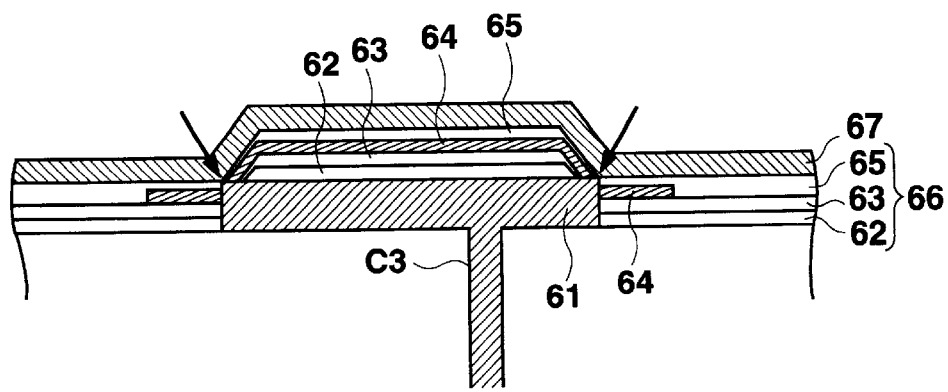
FIG. 4 is a cross-sectional view illustrating a problem of a conventional EL display apparatus.

A driver circuit for each pixel is identical to the circuit shown in FIG. 1, and the difference with the prior art shown in FIGS. 2, 3A, and 3B is the cross-sectional configuration of an anode 1, or first electrode.

The gate signal line 51, the data signal line 52, the driving power supply 53, the electrode 54, and the anode 1 respectively correspond to the gate signal line Gn, the data signal line Dm, the driving power supply 150, the electrode 172 of the storage capacitor 170, and the anode 161 of the organic EL element 160. The gate signal lines 51 are arranged in rows and the data signal lines 52 and the driving supplies 53 are arranged in columns. A capacitor and an emissive layer are arranged within the area that is partitioned by the signal lines and power supply lines. The storage capacitor is formed from the semiconductor film 13 and the electrode 54. The semiconductor film 13 is connected to the data signal line 52 via the contact C1, and the gate electrode 11 is arranged between the drain 13d and the source 13s.

The semiconductor film 43 is connected to the driving power supply 53 via the contact C2, and the gate electrode 41, which is connected to the semiconductor film 13, is arranged between the drain 43d and the source 43s. The semiconductor film 43 is connected to the anode 1 of the organic EL element via the contact C3.

As shown in FIG. 6, the organic EL display apparatus is formed by laminating in sequence a TFT and an organic EL element on the substrate 10, such as a substrate formed from glass or synthetic resin, a conductive substrate, or a semi-conductive substrate. However, when a conductive substrate or a semi-conductive substrate is used for the substrate 10, an insulating film of $SiO_2$ or SiN is formed on the substrate 10, upon which the TFT and organic EL element are formed.

In the present embodiment, a first TFT 30 and a second TFT 40 are both so-called top-gate TFTs provided with a gate electrode at the top of the active layer, and a case is given where a semiconductor film formed from poly-silicon is used for the active layer. Furthermore, the case is given where the TFT has the gate electrode 11 with a double-gate structure.

The first TFT 30, which is a switching TFT, will be described first.

As shown in FIG. 6, on the insulating substrate 10, which is formed from quartz glass, non-alkaline glass, or the like, are formed in sequence the semiconductor film 43 and the gate insulating film 12. The semiconductor film 43 is the active layer of the second TFT, and has the source 43s, the drain 43d, and the channel 43c. On the gate insulating film 12 is formed the gate electrode 41, which is formed from a refractory metal such as chromium (Cr), molybdenum (Mo), or the like, on which is covered with and formed the interlayer insulating film 15, which is formed by laminating in sequence a $SiO_2$ film, a SiN film, and a $SiO_2$ film. Thereon is formed the data signal line 52 and the driving power supply 53.

The TFT has a so-called Lightly Doped Drain (LDD) structure. Namely, ion doping is performed using the gate electrode 41 on a channel 13c as a mask. Furthermore, the gate electrode 41 and an area up to a fixed distance from both sides of the gate electrode 41 are covered with resist, and ion doping is performed again to provide a low concentration area on both sides of the gate electrode 41 and beyond these areas the source 43s and the drain 43d of a high concentration area.

Furthermore, the planarization insulating film 17, which is formed from an organic resin or the like, is formed on the entire surface so as to planarize the surface. A contact hole is then formed at a position corresponding to the source 43s in the planarization insulating film 17, and a transparent first electrode formed from ITO and contacting the source 43s via the contact C3, namely, the anode 1 of the organic EL element, is formed on the planarization insulating film 17.

The emissive element layer 66 adopts a common structure and is formed by laminating in sequence the anode 1 formed from a transparent electrode, such as ITO, the first hole transport layer 62 formed from MTDATA (4,4',4"-tris(3-methylphenylphenylamino)triphenylamine), the second hole transport layer 63 formed from TPD (N,N'-diphenyl-N,N'-di(3-methylphenyl) -1,1'-biphenyl-4,4,-diamine), the emissive layer 64 formed from $Bebq_2$ (bis(10-hydroxybenzo [h]quinolinato) beryllium) including an inductor Quinacridon, the electron transport layer 65 formed from $Bebq_2$, and the cathode 67 formed from a magnesium-indium alloy or a magnesium-silver alloy or a lithium fluoride-aluminum lamination.

Furthermore, in the organic EL element, holes injected from the anode and electrons injected from the cathode recombine within the emissive layer, and the organic molecules included in the emissive layer are excited to yield exitons.

Light is released from the emissive layer in the process where the exitons undergo radiation deactivation, and this light is released to the outside from the transparent anode via the transparent insulating substrate to make the light emission visible.

Arranging display pixels configured in this manner in a matrix on the substrate 10 forms an organic EL display apparatus capable of displaying a desired overall image by controlling each pixel.

The anode 1 of the present embodiment has edges forming tapered inclines as shown in FIG. 6. Due to these inclines, the emissive element layer 66 is smoothly formed from the anode 1 on the planarization insulating layer 17, thereby preventing the coverage from deteriorating and the anode 1 and the cathode 67 from shorting. Furthermore, since the inclines become broader on the substrate side, there are no sharp edges on the top edge of the anode 1 facing the cathode 67, making field concentration less likely to occur. Therefore, the emissive layer 64 emits light uniformly on the entire surface and partial deterioration does not occur rapidly.

Figure 7A:
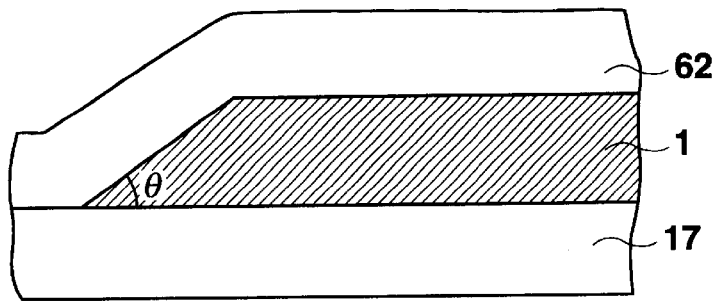
FIGS. 7A and 7B are enlarged cross-sectional views showing the edge of the first electrode of the present invention.
Figure 7B:
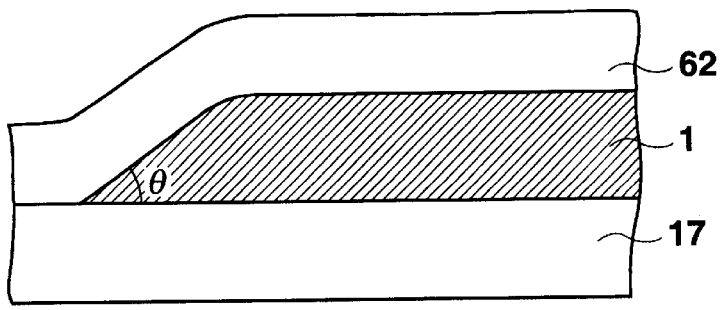

It is preferable for the angle θ formed from the incline of the anode 1 shown in FIGS. 7A and 7B with the plane of the planarization insulating film 17 to be small so as to prevent rupture or field concentration. However, if the angle θ is too small, the edge of the anode 1 becomes extremely thin so that a problem arises where reproducibility of the shape decreases. Therefore, the angle formed by the plane of the bottom layer or the substrate 10 with the inclined side faces of the anode 1 is set from 10° to 45°, and preferably around 30°. Furthermore, it is preferable for the top edge of the anode 1 to have a smooth curve as shown in FIG. 7B.

Figure 8A:
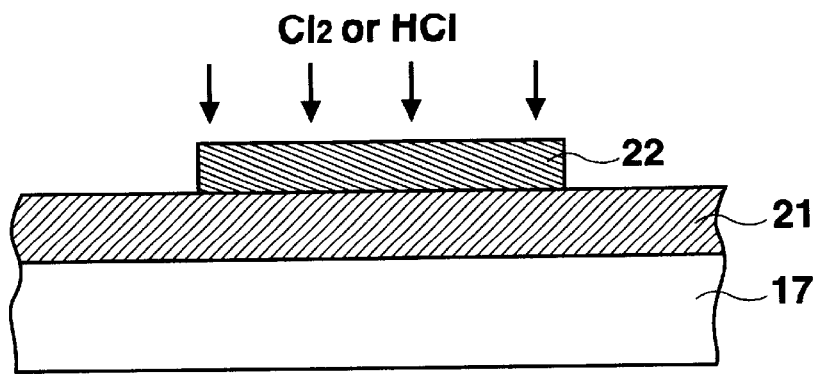
FIGS. 8A, 8B, and 8C are cross-sectional views showing a formation method of the first electrode of the present invention.
Figure 8B:
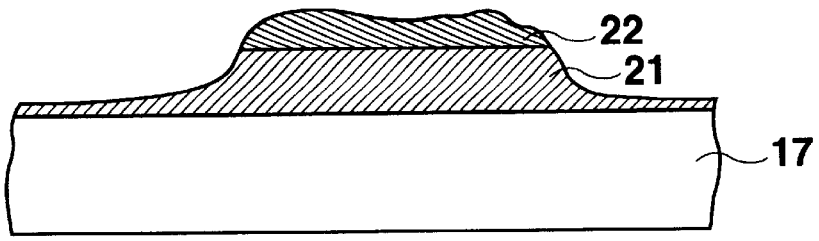
Figure 8C:
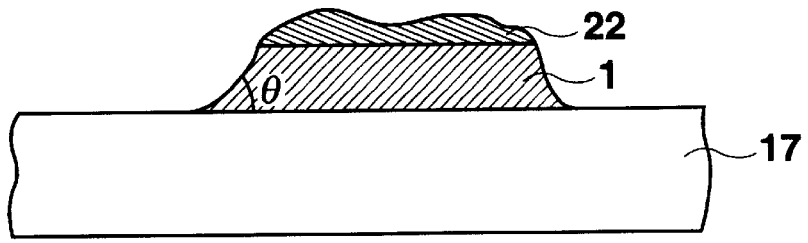

A method for forming the anode 1 into an incline will be described next. As described above, although the etching of the ITO film employed the conventional wet etch method, the angle θ of the incline becomes substantially 90°. In the present embodiment, a positive photoresist is formed on the ITO film, which has been formed on the entire surface, and dry etching is performed using a chlorine-based gas, such as $Cl_2$ or HCl, to form an incline on the ITO edge. FIGS. 8A to 8C are cross-sectional views showing the formation method of the anode 1. First, as shown in FIG. 8A, an ITO film 21 is formed on the entire surface of the planarization insulating film 17. Next, a positive photoresist 22 is formed at a predetermined area. When this is exposed to a chlorine-based gas, such as chlorine gas or hydrogen chloride gas, the ITO film 21 and the photoresist 22 are etched isotropically. With dry etching using chlorine-based gas, the selectivity is low between the ITO film 21 and the photoresist 22 so that the photoresist 22 is etched simultaneously with the ITO film 21. However, since etching is faster for the ITO film 21, the etching proceeds as shown in FIG. 8B even though the selectivity is low. The etching continues and completes as shown in FIG. 8C. In the present embodiment, the angle θ of the incline becomes approximately 30°. In this manner, the isotropic etching is performed using an etching gas having low selectivity between the ITO film and the resist so that the anode 1 is formed with sloping edges.

The film thickness of the anode 1 is described next. The film thickness of the anode 1 is thinly formed compared to the total film thickness of the emissive element layer 66. When the film thickness of the anode 1 is thin, a step developing between it and the planarization insulating film 17 is reduced so that a rupture of the emissive element layer 66 can be prevented. Since the color of the display changes depending on the thickness of the anode 1, an arbitrary thickness cannot necessarily be set. The film thickness of the anode 1 is set to ½ the total thickness of the emissive element layer 66 or less if possible, and preferably to ⅓ or less. However, if the anode 1 is formed too thin, the reproducibility of the shape decreases due to chipping of part of the anode 1 and so forth. In the present embodiment, the anode 61 has a thickness of approximately 85 nm, the emissive element layer 66 has a total thickness of approximately 200 nm, and the cathode 67 has a thickness of approximately 200 nm.

Figure 9:
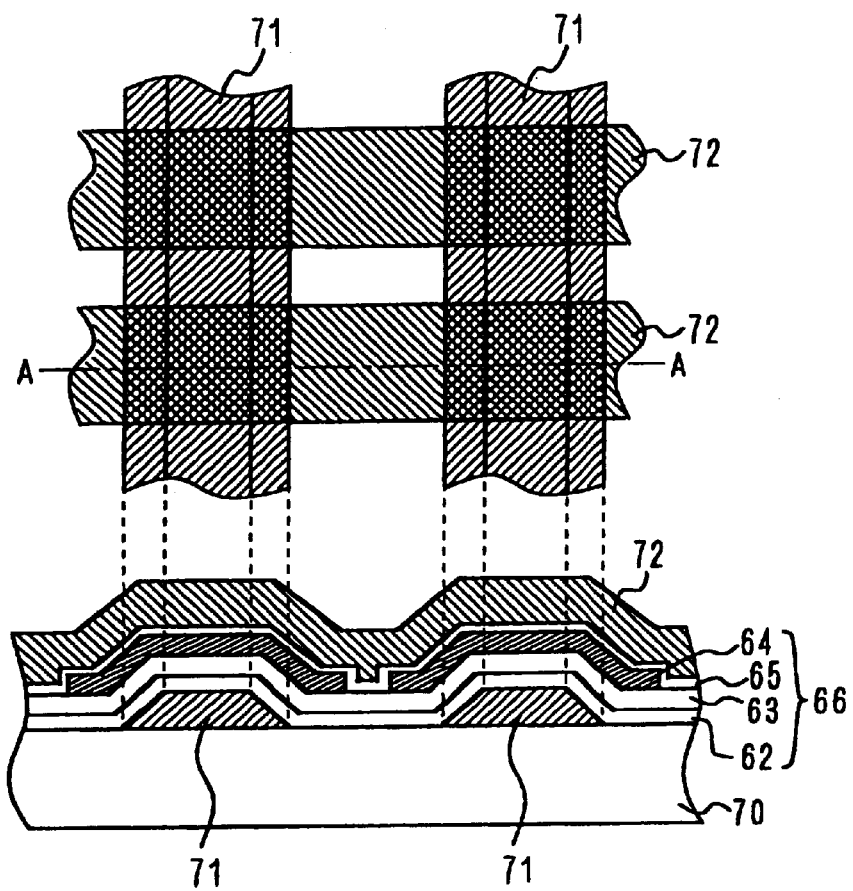
FIG. 9 is a top view and a cross-sectional view of a simple-matrix EL display apparatus of the present invention.

The present invention is also applicable to a simple-matrix EL display apparatus. FIG. 9 shows a top view and a cross-sectional view along line A—A of the simple-matrix EL display apparatus representing a second embodiment of the present invention.

Arranged on a transparent substrate 70 are an anode 71, which is a first electrode extending longitudinally, and a cathode 72, which is a second electrode extending transversely and crossing the first electrode 71. In the emissive element layer 66, the emissive layer 64 is formed at each intersection of the anode 71 and the cathode 72.

Although the TFT was illustrated in the aforementioned embodiments as having the top-gate structure in which the gate electrode is located on the active layer, it may have a bottom-gate structure instead. Furthermore, although a semiconductor film was used for the active layer in the aforementioned embodiments, a micro-crystalline silicon film or amorphous silicon may be used instead.

In this embodiment also, the edge of the anode 71 inclines and becomes broader toward the substrate so that the emissive element layer 66 smoothly covers the anode 71, thereby preventing shorts between the anode 71 and the cathode 72.

Furthermore, although an organic EL display apparatus was described in the aforementioned embodiments, the present linvention is not limited thereto, and may be also applicable to an inorganic EL display apparatus having a emissive layer formed from inorganic materials, while yielding a similar effect.

Furthermore, although the first electrode was described in the present specification as an anode, the first electrode is arranged between the substrate and the EL element (EL layer) and is the electrode covered by the EL layer so that in some cases it may be a cathode.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. An electroluminescence display apparatus comprising:
a first electrode formed above a substrate;
an emissive element layer formed on said first electrode;
a second electrode formed on said emissive element layer; side faces of said first electrode are inclined and become broader toward the substrate side; and
a planarization insulating film formed so as to cover said thin-film transistor, with said first electrode formed on said planarization insulating film,
wherein said first electrode is unique to a pixel, and the apparatus is an active-matrix type having a thin-film transistor for driving said emissive element.

2. An electroluminescence display apparatus according to claim 1 wherein inclined side faces of said first electrode has an angle from 10 degrees to 45 degrees with respects to the plane of the lower layer and/or the substrate.

3. An electroluminescence display apparatus according to claim 1 wherein inclined side faces of said first electrode has an angle from 25 degrees to 35 degrees with respects to the plane of the lower layer and/or the substrate.

4. An electroluminescence display apparatus according to claim 3 wherein a thickness of said first electrode is less than ½ a film thickness of said emissive element layer.

5. An electroluminescence display apparatus according to claim 3 wherein a thickness of said first electrode is less than ⅓ a film thickness of said emissive element layer.

6. An electroluminescence display apparatus comprising:
a first electrode formed above a substrate;
an emissive element layer formed on said first electrode;
a second electrode formed on said emissive element layer; side faces of said first electrode are inclined and become broader toward the substrate side; and
a planarization insulating film formed so as to cover said thin-film transistor, with said first electrode formed on said planarization insulating film,
wherein said first electrode is unique to a pixel, and the apparatus is an active-matrix type having a thin-film transistor for driving said emissive element,
wherein a thickness of said first electrode is less than ½ a film thickness of said emissive element layer.

7. An electroluminescence display apparatus comprising:
a first electrode formed above a substrate;
an emissive element layer formed on said first electrode;
a second electrode formed on said emissive element layer; side faces of said first electrode are inclined and become broader toward the substrate side; and
a planarization insulating film formed so as to cover said thin-film transistor, with said first electrode formed on said planarization insulating film,
wherein said first electrode is unique to a pixel, and the apparatus is an active-matrix type having a thin-film transistor for driving said emissive element,
wherein a thickness of said first electrode is less than ⅓ a film thickness of said emissive element layer.

8. An electroluminescence display apparatus comprising:
a first electrode formed above a substrate;
an emissive element layer formed on said first electrode; and
a second electrode formed on said emissive element layer; side faces of said first electrode are inclined and become broader toward the substrate side;
wherein said first electrode extends in a first direction and said second electrode extends in a second direction so as to intersect said first electrode,
wherein a thickness of the emissive element layer is approximately 200 nm.

9. An electroluminescence display apparatus according to claim 1 wherein said emissive element layer comprises a layered structure of a hole transport layer, an emissive layer, and an electron transport layer.

10. A method for manufacturing an active matrix type electroluminescence display apparatus, the method comprising:
forming a thin film transistor above a substrate;
forming a planarization insulating film covering said thin film transistor;
forming a first electrode on said planarization insulating film;
forming an emissive elements layer on said first electrode; and
forming a second electrode on said emissive elements,
wherein in said forming said first electrode, a dry etching process is applied using a chlorine-based gas so that side faces of said first electrode are inclined and become broader toward the substrate side.

11. The method according to claim 10, wherein inclined side faces of said first electrode has an angle from 10 degrees to 45 degrees with respect to a plane of a lower layer and/or the substrate.

12. The method according to claim 10, wherein inclined side faces of said first electrode has an angle from 25 degrees to 35 degrees with respect to a plane of a lower layer and/or the substrate.

13. The method according to claim 12, wherein a thickness of said first electrode is less than ½ a thickness of said emissive element layer.

14. The method according to claim 12, wherein a thickness of said first electrode is less than ⅓ a thickness of said emissive element layer.

15. The method according to claim 10, wherein a thickness of said first electrode is less than ½ a thickness of said emissive element layer.

16. The method according to claim 10, wherein a thickness of said first electrode is less than ⅓ a thickness of said emissive element layer.

17. The method according to claim 10, wherein said emissive elements layer comprises a layered structure of a hole transport layer, an emissive layer, and an electron transport layer.

* * * * *